United States Patent
Cho et al.

(10) Patent No.: US 9,625,893 B2
(45) Date of Patent: Apr. 18, 2017

(54) METHOD OF USING AN INSTALLATION GUIDE SYSTEM TO CONFIGURE AN AIR CONDITIONER OR HVAC ARRANGEMENT

(71) Applicant: LG ELECTRONICS INC., Seoul (KR)

(72) Inventors: Sangeun Cho, Changwon-si (KR); Shinae Kang, Changwon-si (KR); Jungyul Park, Changwon-si (KR); Haerim Lee, Changwon-si (KR); Mingyu Park, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 612 days.

(21) Appl. No.: 13/685,922

(22) Filed: Nov. 27, 2012

(65) Prior Publication Data

US 2013/0138249 A1 May 30, 2013

(30) Foreign Application Priority Data

Nov. 30, 2011 (KR) ........................ 10-2011-0126780

(51) Int. Cl.
*G05B 21/00* (2006.01)
*G01M 1/38* (2006.01)
(Continued)

(52) U.S. Cl.
CPC ......... *G05B 19/02* (2013.01); *G06F 17/5004* (2013.01); *F24F 2011/0091* (2013.01)

(58) Field of Classification Search
CPC ................ G05B 19/02; G06F 17/5004; F24F 2011/0091
(Continued)

(56) References Cited

U.S. PATENT DOCUMENTS 7,702,421 B2  4/2010 Sullivan et al.
2003/0200062 A1* 10/2003 Dessureault ........ G06F 17/5004
                                                          703/1
(Continued)

FOREIGN PATENT DOCUMENTS

CN  1467443 A  1/2004
CN  101923587 A  12/2010
(Continued)

OTHER PUBLICATIONS

International Search Report dated Feb. 14, 2013.
(Continued)

*Primary Examiner* — Ziaul Karim
(74) *Attorney, Agent, or Firm* — Ked & Associates LLP

(57) ABSTRACT

A method of using an installation guide system to configure an air conditioner or HVAC arrangement is provided. The installation guide system may include an input configured to receive inputs from a user; a memory configured to store information; a display; and a controller configured to control the input, the memory, and the display. The method may include receiving input, into the installation guide system, of installation information to be used to configure the air conditioner or HVAC arrangement; displaying on a drawing display of the display at least one image of an installation space for the air conditioner or HVAC; configuring the installation information with respect to the at least one image of the installation space; arranging apparatuses constituting an air conditioner or HVAC on the drawing display to create a design drawing for an air conditioner or HVAC arrangement based on the installation information; and inspecting the air conditioner or HVAC arrangement for errors.

18 Claims, 18 Drawing Sheets

(51) Int. Cl.
*G05B 13/00* (2006.01)
*G05B 15/00* (2006.01)
*G05D 23/00* (2006.01)
*G05B 19/02* (2006.01)
*G06F 17/50* (2006.01)
*F24F 11/00* (2006.01)

(58) Field of Classification Search
USPC .................................................. 700/276–278
See application file for complete search history.

(56) References Cited

U.S. PATENT DOCUMENTS

| | | | |
|---|---|---|---|
| 2005/0256693 A1* | 11/2005 | Meisenecker | G06T 19/00 703/22 |
| 2007/0096902 A1* | 5/2007 | Seeley | G06Q 10/10 340/539.18 |
| 2007/0219764 A1* | 9/2007 | Backe et al. | 703/6 |
| 2009/0026396 A1* | 1/2009 | Moenkhaus et al. | 251/129.02 |
| 2009/0188985 A1* | 7/2009 | Scharing et al. | 237/1 R |
| 2012/0072181 A1* | 3/2012 | Imani | 703/1 |

FOREIGN PATENT DOCUMENTS

| | | |
|---|---|---|
| JP | 2007-108903 A | 4/2007 |
| KR | 10-1998-084697 | 12/1998 |
| KR | 10-1999-0050327 | 7/1999 |
| KR | 10-0564931 | 3/2006 |
| KR | 10-0860035 | 9/2008 |

OTHER PUBLICATIONS

Chinese Search Report issued in related Application No. 2012800590972 dated Apr. 13, 2016.
Chinese Office Action dated Jan. 5, 2017.

* cited by examiner

SELECT CONNECTION POINT OR [SMART WIRING (s)] / PARALLEL PATH WIRING / INDEPENDENT REFRIGERANT PIPE (R) / INDEPENDENT DRAIN PIPE (D)]:

FIG.16

SYSTEM EFFECTIVENESS INSPECTION

OUTDOOR DEVICE LIST

| ITEM | GROUP ID | INSTALLATION POSITION | COMBINATION RATIO(%) | COOLING | HEATING | Pipe | Syst... | CHECK TIME |
|---|---|---|---|---|---|---|---|---|
| ☑ MultiV III:ARIA120LT3 | OAG-1-1 | PENTHOUSE FLOOR | 126.19 | 37.70 | 47.71 | ☑ | ☑ | 2011-06-21 |
| ☑ MultiV III:ARUV280LT3 | OAc-2-1 | PENTHOUSE FLOOR | 126.70 | 88.04 | 0.00 | ☑ | ☑ | 2011-06-21 |
| ☑ MultiV Super III:LRP-N1638BP | OAC-3-1 | PENTHOUSE FLOOR | 123.13 | 17.54 | 19.23 | ☑ | ☑ | 2011-06-21 |

APPARATUS POSITION SEARCH ☐

CAPACITY VERIFICATION RESULT

| CONTENTS | LIMIT | CURRENT VALUE (MAXIMUM VALUE:SELECTED APPARATUS) |
|---|---|---|
| TOTAL PIPE LENGTH | 1000.0 m | 68.7 π |
| LONGEST PIPE LENGTH (EQUIVALENT LENGTH) | 200.0 m | 45.9 π :ARNU36GTNC2[i1] |
| LONGEST EQUIVALENT PIPE LENGTH AFTER FIRST BRANCHED PIPE | 40.0 m | 31.3 π :ARNU36GTNC2[i1] |
| HEIGHT DIFFERENCE (ABOVE OUTDOOR UNIT) | 110.0 m | |
| HEIGHT DIFFERENCE (BELOW OUTDOOR UNIT) | 110.0 m | 0.8 m :ARNU36GTNC2[i·] |
| HEIGHT DIFFERENCE (BETWEEN INDOOR UNITS) | 15.0 m | 0.0m:ARNU36GTNC2[i1]-ARNU36GTNC2[i1] |
| LONGEST PIPE LENGTH (MOUNTING) | 150.0 m | 43.9m:ARNU36GTNC2[i·] |

ARUN120LT3 : SYSTEM INSPECTION IS SUCCESSFULLY COMPLETED

CAPACITY VERIFICATION MODE
- ● COOLING
- ○ HEATING

- ● General
- ○ Conditional

COMBINATION RATIO RANGE
MAXIMUM VALUE: 200.0 %
MINIMUM VALUE: 50.0 %

[SYSTEM ANALYSIS]

REPORT OUTPUT
Default ▸

APPARATUS TALBE

APPARATUS SELECTION TABLE

BRMS OUTPUT

ATTRIBUTE INFORMATION

CONFIRM 390, 391, 392, 393, 394, 395, 396, 397

METHOD OF USING AN INSTALLATION GUIDE SYSTEM TO CONFIGURE AN AIR CONDITIONER OR HVAC ARRANGEMENT

CROSS-REFERENCE TO RELATED APPLICATION(S)

The present application claims priority to Korean Patent Application No. 10-2011-0126780, filed in Korea on Nov. 30, 2011, which is hereby incorporated by reference in its entirety.

BACKGROUND OF THE INVENTION

1. Field of the Invention

A method of using an installation guide system to configure an air conditioner or HVAC arrangement is disclosed herein.

2. Description of Related Art Including Information Disclosed Under 37 CFR 1.97 and 1.98

Processes for configuring air conditioners or HVACs are known. However, they suffer from various disadvantages.

BRIEF DESCRIPTION OF THE SEVERAL VIEWS OF THE DRAWING(S)

Embodiments will be described in detail with reference to the following drawings in which like reference numerals refer to like elements, and wherein:

FIGS. 10 to 12 are views of a refrigerant pipe and a branched part automatically connected to a main pipe according to an embodiment;

FIG. 16 is a schematic front view of a system inspection display according to an embodiment;

DETAILED DESCRIPTION OF THE INVENTION

Figure 1:
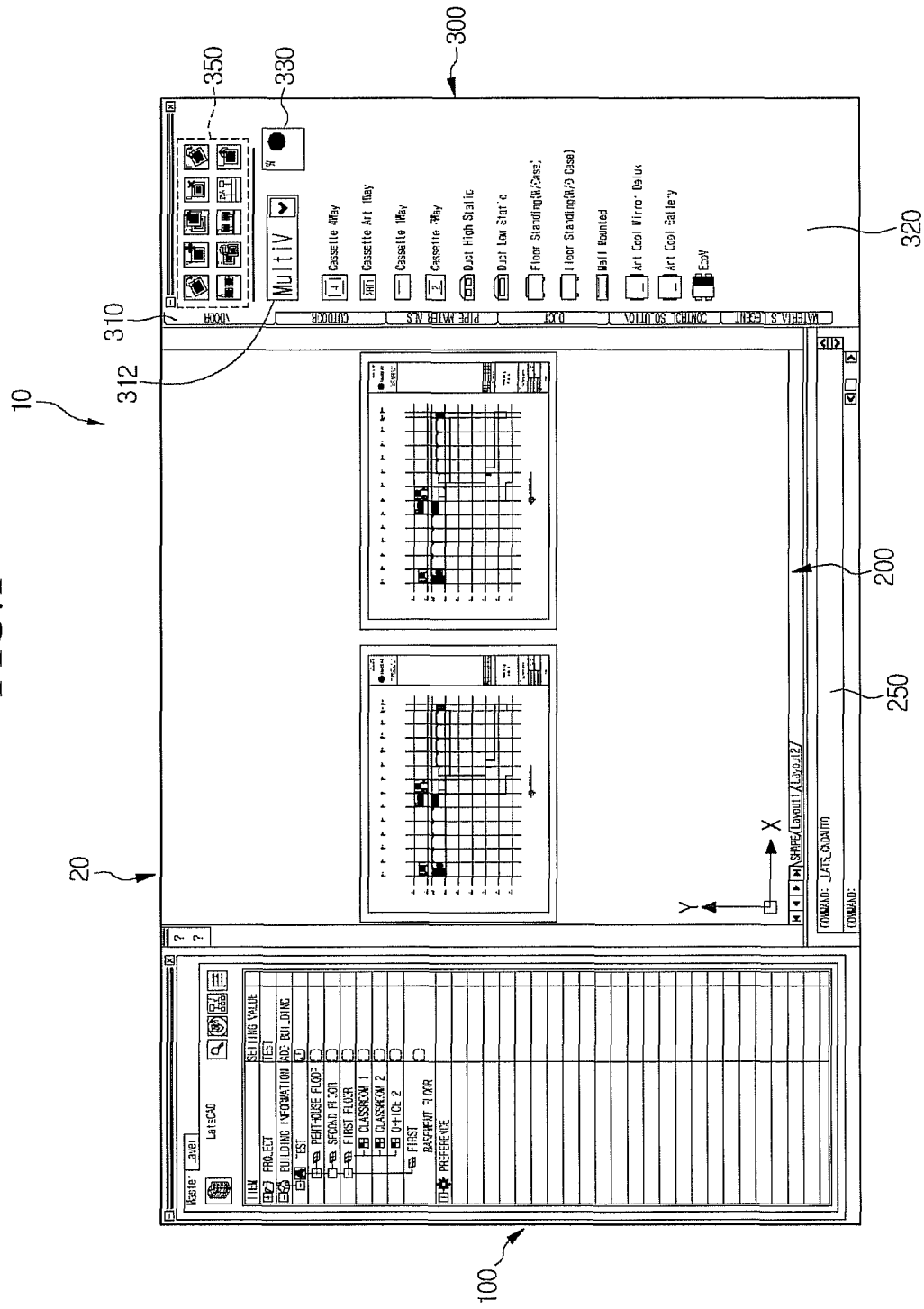
FIG. 1 is a schematic front view of an installation guide system according to an embodiment.

Reference will now be made in detail to embodiments, examples of which are illustrated in the accompanying drawings. Where possible, like reference numerals have been used to indicate like elements.

Hereinafter, with reference to the drawings, embodiments are described. However, the scope is not limited to the disclosed embodiments, and those skilled in the art may easily suggest other embodiments within the same scope of the idea.

An air conditioner is a home appliance that maintains indoor air in an appropriate or desired state. For example, an air conditioner may adjust indoor air to be in a cool state in summer, adjust indoor air to be in a warm state in winter, adjust indoor humidity, and adjust indoor air to be in a pleasant and clean state.

In more detail, in such an air conditioner, a refrigeration cycle may be driven to perform refrigerant compression, condensation, expansion, and evaporation processes, and accordingly, an indoor space cooling or heating operation may be performed. According to whether an indoor unit or device and an outdoor unit or device are separated, such an air conditioner may be divided into a separate-type air conditioner (in which an indoor device and an outdoor device are separated from each other) and an integrated-type air conditioner (in which an indoor device and an outdoor device are integrated into one unit). The outdoor device may include an outdoor heat exchanger that heat exchanges outdoor air and the indoor device may include an indoor heat exchanger that heat exchanges indoor air. The air conditioner may operate to switch to a cooling mode or a heating mode.

A plurality of indoor devices or outdoor devices may be installed at or in one building. In the case of a commercial air conditioner, a high capacity outdoor device may be arranged outside of a building, and indoor devices may be installed at or in a plurality of spaces in or on each floor of the building. A proper number of outdoor devices or indoor devices may be installed in consideration of a size and structure of a building and building capacity.

In the process of building design, a proper number of outdoor devices or indoor devices may be selected in consideration of a condition of the building, and also, an arrangement of a refrigerant pipe, a branched pipe, or a drain pipe, and a controller. However, in a related art process of designing an air conditioner in a building, because design drawings of the building and installation drawings of the air conditioner follow different workflows, the drawings may not match each other. Therefore, designing the building and installing an air conditioner may not be easily performed.

Moreover, as communication between parties may not be effectively made regarding installation information for the air conditioner (for example, building information or capacity of the air conditioner), an actually required number of indoor devices or outdoor devices may be not installed and/or refrigerant pipes may not be installed at proper positions.

As mentioned above, when the air conditioner is not properly installed in a building, cooling and heating efficiencies may be poor and failures may occur during use of the air conditioner.

FIG. 1 is a schematic front view of an installation guide system according to an embodiment. The installation guide system may function as a user interface. Further, the installation guide system according to embodiments is discussed herein as used to configure an air conditioner or HVAC. However, embodiments are not so limited. That is, the installation guide system may be used to configure any type of cooling and/or heating system.

Referring to FIG. 1, the installation guide system 10 may include a display 20 that provides a guide for installation (for example, a layout-design) of an air conditioner or HVAC to a user. The display 20 may be displayed when predetermined information (for example, a specific program) is executed, and may be understood as a user interface that outputs required information in response to a user's command input. The specific program may be executed in, for example, a PC, a terminal, a server, or a control device or controller.

The display 20 may include an installation information display 100 that displays project information (for example, an installation process) for installing an air conditioner, information (for example, building information) on an installation space in which an air conditioner or HVAC is to be installed, and preference information for configuring an air conditioner or HVAC system or arrangement. In more detail, the installation information display 100 may display a project, building information, and a configuration as an "item", and a configuration value for each "item" at one side of the "item". The installation information display 100 may be arranged in one partitioned area of an entire area of the display 20.

The display 20 may include a drawing display 200 that displays information on a space having or to have an air conditioner or HVAC installed (for example, floor information or room information of a building), or arrangement information on detailed devices (or apparatuses) of an air conditioner or HVAC to be installed at or in the building. For example, the room information may be information on partitioned rooms at or on each floor of the building.

A drawing relating to a structure of a building may be displayed on the drawing display 200, and installation information on an air conditioner or HVAC may be displayed on the drawing. The drawing display 200 may be displayed on another partitioned area of the entire area of the display 20.

A command display 250 that receives input of a predetermined command relating to an air conditioner or HVAC into the drawing relating to the structure of the building may be displayed on or at one side of the drawing display 200. The command display 250 may display, for example, characters or symbols input during a corresponding step when a user manipulates a system and a user may select displayed characters or symbols or may input new characters or symbols in order to execute a predetermined command.

The display 20 may include a product information display 300 that displays information on a detailed configuration (or an apparatus) of an air conditioner or HVAC to be arranged on each floor or in each room of a building. The product information display 300 may be displayed on another partitioned area of the entire area of the display 20.

For example, the display 20 may be divided into three areas, and the three areas may display the installation information display 100, the drawing display 200, and the product information display 300, respectively. The installation information display 100 and the product information display 300 may be combined and referred to as a "guide display", in that they display various menus for arranging an air conditioner or HVAC on the drawing display 200.

The product information display 300 may include a product selector 310 that displays a detailed configuration of the air conditioner or HVAC. For example, the detailed configuration of the air conditioner or HVAC may include, for example, indoor devices, outdoor devices, pipe materials, ducts, control solutions, and materials legends.

The product information display 300 may include a list display 320 that displays a list of a detailed configuration of the air conditioner or HVAC. For example, when an indoor device is selected as part of a detailed configuration of the air conditioner or HVAC, the list display 320 may display a plurality of lists according to a type of indoor device.

The product information display 300 may further include an edit toolbar display 350 that displays tools to arrange, modify, and/or add/delete functions as, for example, icons.

Figure 2:
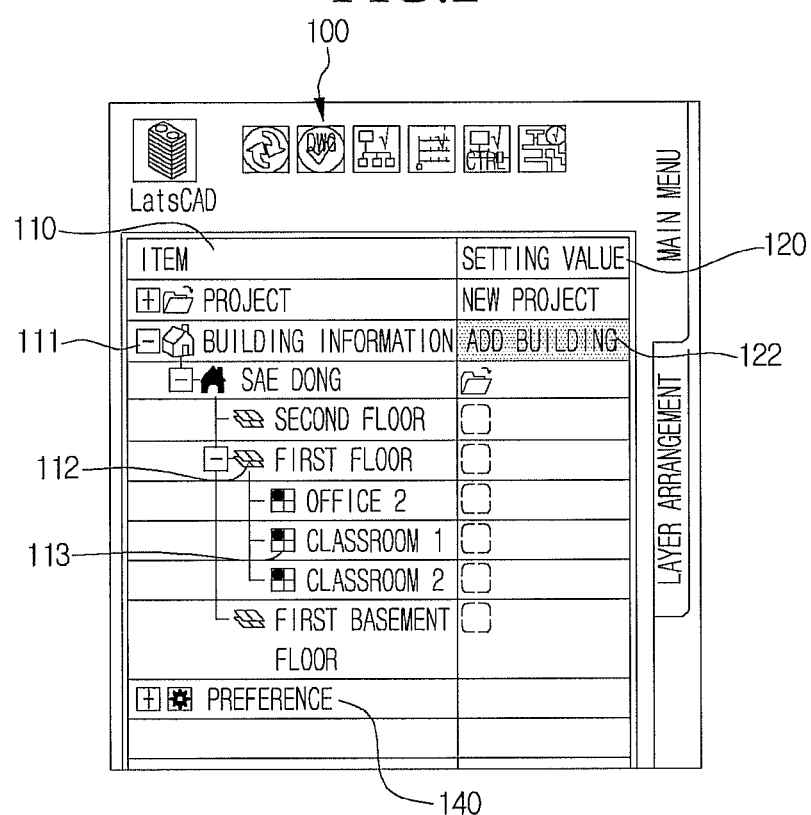
FIG. 2 is a schematic front view of an installation information display according to an embodiment.
Figure 3:
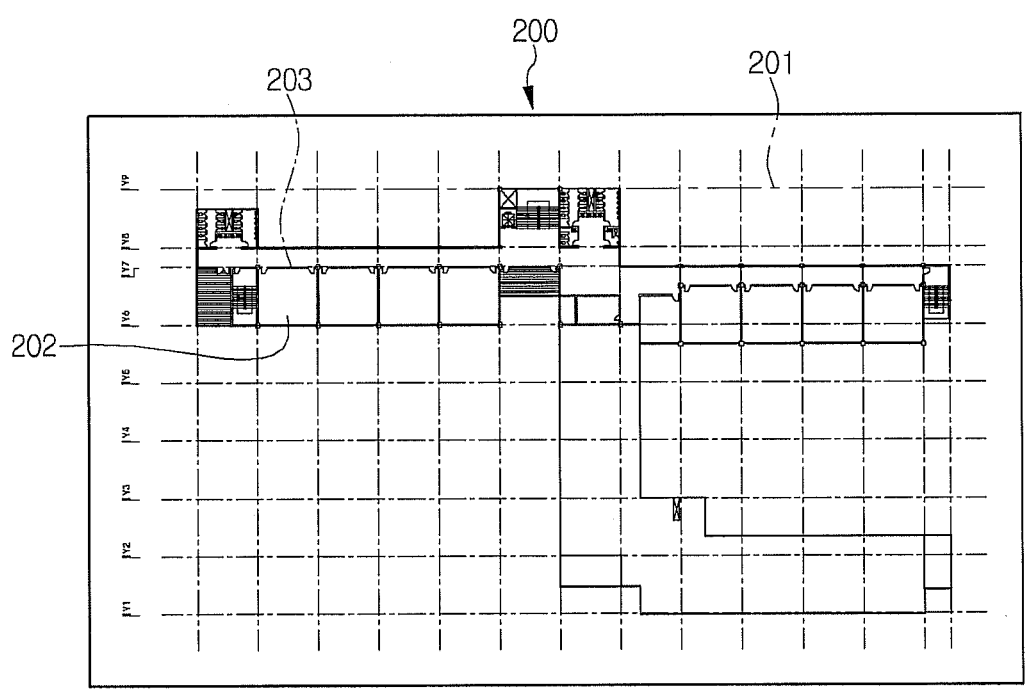
FIG. 3 is a schematic front view of a drawing display for configuring a room area according to an embodiment.

FIG. 2 is a schematic front view of an installation information display according to an embodiment. FIG. 3 is a schematic front view of a drawing display for configuring a room area according to an embodiment.

Referring to FIG. 2, the installation information display 100 may display information (hereinafter, referred to as "building information") on a building having or to have an air conditioner or HVAC installed therein. In the process of installing an air conditioner or HVAC in a building, the installation information display 100 may be updated. FIG. 2 is a schematic front view of the installation information display 100.

The installation information display 100 may include an item display 110 that displays items of installation information and a configuration value display 120 that displays a configuration value for each item. In more detail, the item display 110 may include a building display 111 that displays information on a building (for example, the name of a building), a floor display 112 that displays information on each floor (for example, a name of a floor), and a room display 113 that displays information on each room on a floor (for example, a name of a room).

As shown in FIG. 2, looking at building information generated by the item display 110, the name of a building is "sae dong" and the building includes two floors above the ground and one underground floor. The first floor includes an office 2, a classroom 1, and a classroom 2.

The configuration value display 120 may include a building addition selector 122 that adds a building (or a complex) to which an air conditioner or HVAC is to be installed. The building addition selector 122 may display selectable information, such as "building addition".

When one of the room names displayed on the item display 110 is selected, an information management display may be displayed. The information management display may include, for example, a "room basic information", "load information", "indoor device capacity", and "ventilation information". The room basic information may include, for example, a floor name, a room name, a room CAD area, and room area information. If there is a difference between the room CAD area and the room area information, both areas may be adjusted to be identical to each other. When the room area designation is made (see FIG. 3), the room CAD area and the room area information may be generated or updated.

The load information may include, for example, a unit load relating to a cooling and heating load and actual load information. As mentioned above, the unit load may be configured in advance or newly input. The actual load information may be determined by the value obtained by multiplying room area information, generated or updated in a room area designation process, and a unit load. Additionally, the indoor room capacity and ventilation information may be generated or updated by an arrangement process of an indoor device and a ventilation device.

Further, the floor information displayed on the installation information display 100 and a structure drawing displayed on the drawing display 220 may be matched to each other by selecting the floor display 112. In more detail, when the floor display 112 is selected, a plurality of detailed menus may be displayed. When a "floor area designation" menu is selected from the plurality of detailed menus and an area of a corresponding floor is configured on the drawing display 200, an area may be matched so that it is determined that the corresponding floor corresponds to a portion on the drawing. A method of configuring an area of a corresponding floor in the drawing display 200 may include dragging and configuring using, for example, a computer mouse. Also, the reference point of each floor may be configured by selecting a "floor reference point configuration" menu from the plurality of detailed menus.

Furthermore, room information displayed on the installation information display 110 and the structure drawing displayed on the drawing display 200 may be matched to each other by selecting the floor display 113. In more detail, when the floor display 113 is selected, a plurality of detailed menus may be displayed. When a "room area creation" menu is selected from the plurality of detailed menus and an area of a corresponding room is configured on the drawing display 200, an area may be matched so that it is determined that the corresponding room corresponds to which portion on the drawing.

For example, as shown in FIG. 3, the drawing display 200 may include a first floor drawing 201 that displays a structure of a first floor. The first floor drawing 201 may include a first room 202, which may be understood as one example of a plurality of rooms. When a boundary area of the first room 202 (for example, an outer boundary line) is configured, a room area display 203 may be designated. A method of configuring an area may be identical to that of configuring a floor area.

Figure 5:
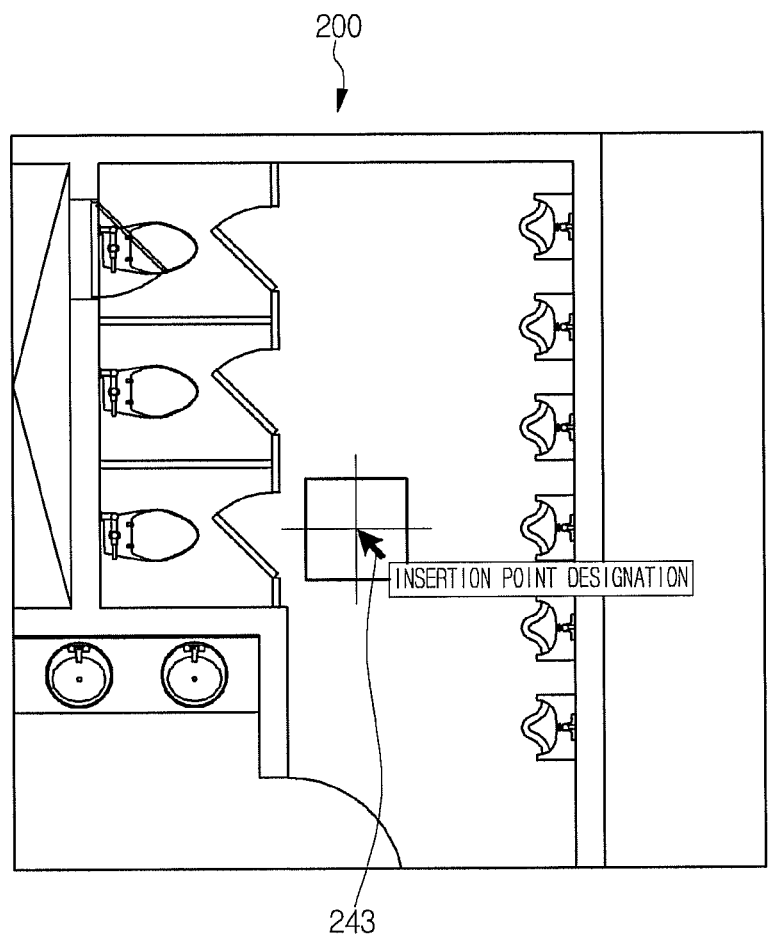
FIG. 5 is a schematic front view of a drawing display showing an indoor device arrangement point according to an embodiment.

As mentioned above, when matching between information on the installation information display 100 and information on the drawing display 200 is made after floor area and room area designations are completed, as shown in FIG. 5, a configuration value display 120 may display a predetermined symbol (for example, "R") that displays that a designation (for example, matching) between building information and a drawing is completed. That is, a matching completion display may include "F" as a floor configuration value and "R" as a room configuration value.

After the matching is completed, as one floor is selected from a plurality of floors displayed on the floor display 112, information on a plurality of rooms in the selected floor may be displayed. At this point, the displayed information on the plurality of rooms may include a pop-up window or display and may be displayed on the drawing display 200.

Moreover, while a room area designation is made through the drawing display 200, if the one floor is selected, the displayed information on the plurality of rooms may include the area and load information of each room.

Figure 4:
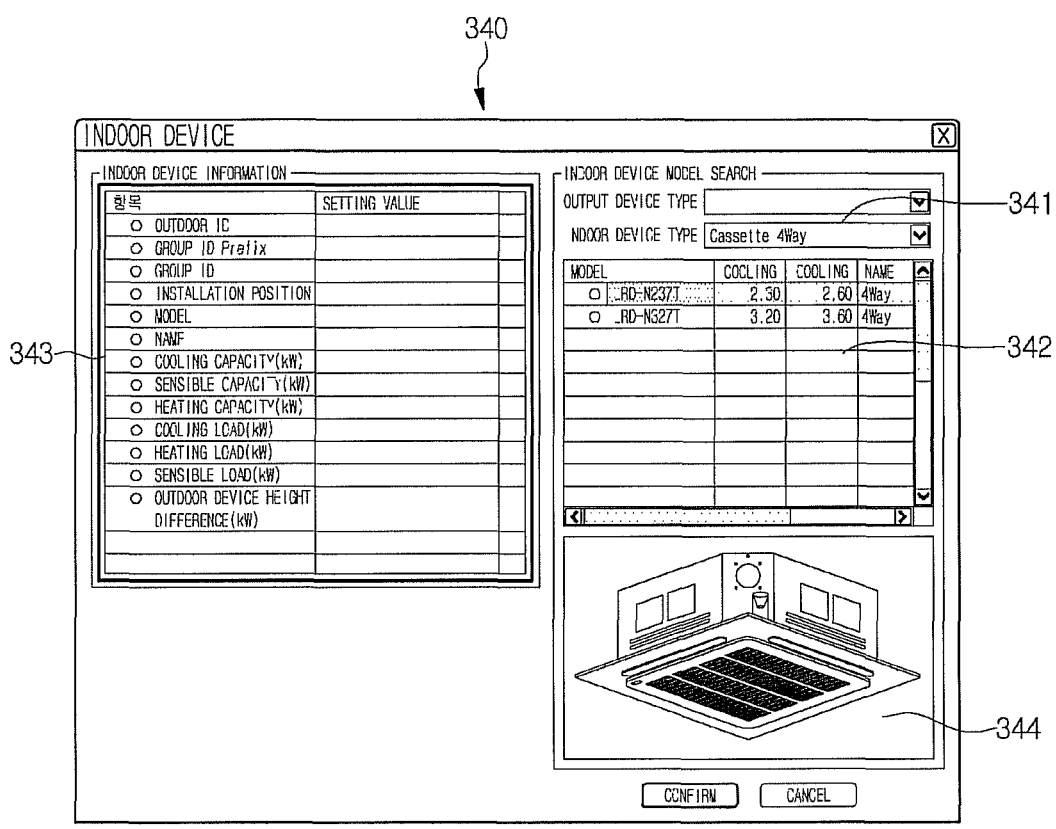
FIG. 4 is a schematic front view of an indoor type display according to an embodiment.

FIG. 4 is a schematic front view of an indoor device type display according to an embodiment. FIG. 5 is a schematic front view of a drawing display that displays an indoor unit arrangement point according to an embodiment.

Referring to FIGS. 1, 4, and 5, a process of arranging the drawing display 200 by selecting a desired type of an indoor device will be described. Referring to FIG. 1, the product information display 300 may include the product selector 310 that provides for selection of one of a plurality of products constituting an air conditioner or HVAC, such as indoor devices, outdoor devices, pipe materials, ducts, control solutions, and materials legends.

Also, the product information display 300 may include a category selector 312 that provides for selection of a category of product selected by the product selector 310. The category may be understood as a category of an air conditioner or HVAC. For example, when an indoor device is selected by the product selector 310, the category selector 312 may include "Single", "Multi/Single A", and/or "Multi V" types, as selectable menus.

The product information display 310 may include the list display 320 which displays types of related indoor devices on the basis of the information selected by or via the product selector 310 and the category selector 312. The product information display 300 may include an executable automatic arrangement selector 330 that automatically arranges indoor devices on the drawing display 200 if the indoor devices are selected as products to be installed. The automatic arrangement selector 330 may be activated only when an "indoor device" is selected by the product selector 310. When at least one indoor device is selected by or via the list display 210, as shown in FIG. 4, the display 20 may display an indoor device type display 340.

The indoor device type display 340 may include a type selector 341 that allows selection of a type of an indoor device, a model display 342 that displays a model of the selected indoor device type, and a shape display 344 that displays a shape of the selected model.

The type display 341 may include a plurality of selectable types, and changing into or selecting different types may be possible. When one of a plurality of types in the type display 341 is selected, at least one model name corresponding to the selected type may be displayed on the model display 342. Moreover, the shape display 344 may display the shape of the selected model, that is, one model of the plurality of models.

The product information display 340 may include the product selector 200 that displays a detailed configuration of the air conditioner or HVAC. That is, an indoor device information display 343 may display information corresponding to an indoor device of the model selected by the model display 342. For example, the information may include, for example, model, name, cooling and heating capacity, and cooling and heating load of the indoor device. After the type and model of an indoor device are selected, as a "confirm" button is input or selected, an indoor device to be arranged may be determined.

When one model for an indoor device is selected through the indoor device type display 340, the indoor device of the selected model may be arranged on the drawing display 200. In more detail, a user may select one point of the drawing display 200, and then, recognize an indoor device arrangement point 243. For example, one point where an indoor device is to be arranged may be selected using, for example, a computer mouse. Once the indoor device arrangement point 243 is recognized, an indoor device determined in FIG. 4 may be inserted into the drawing displaying 200.

Figure 6:
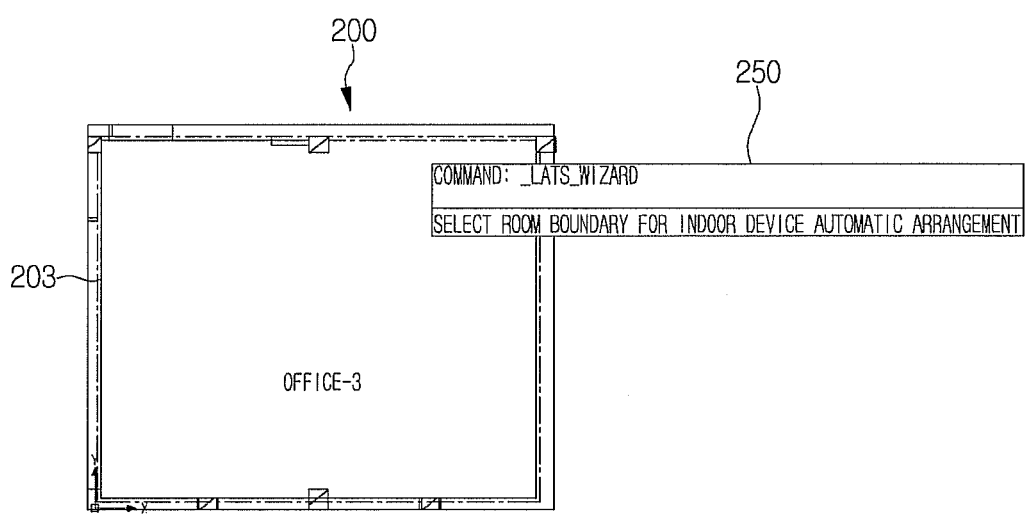
FIG. 6 is a schematic front view of a drawing display having a room area display and a command display during an automatic arrangement process of an indoor device according to an embodiment.
Figure 7:
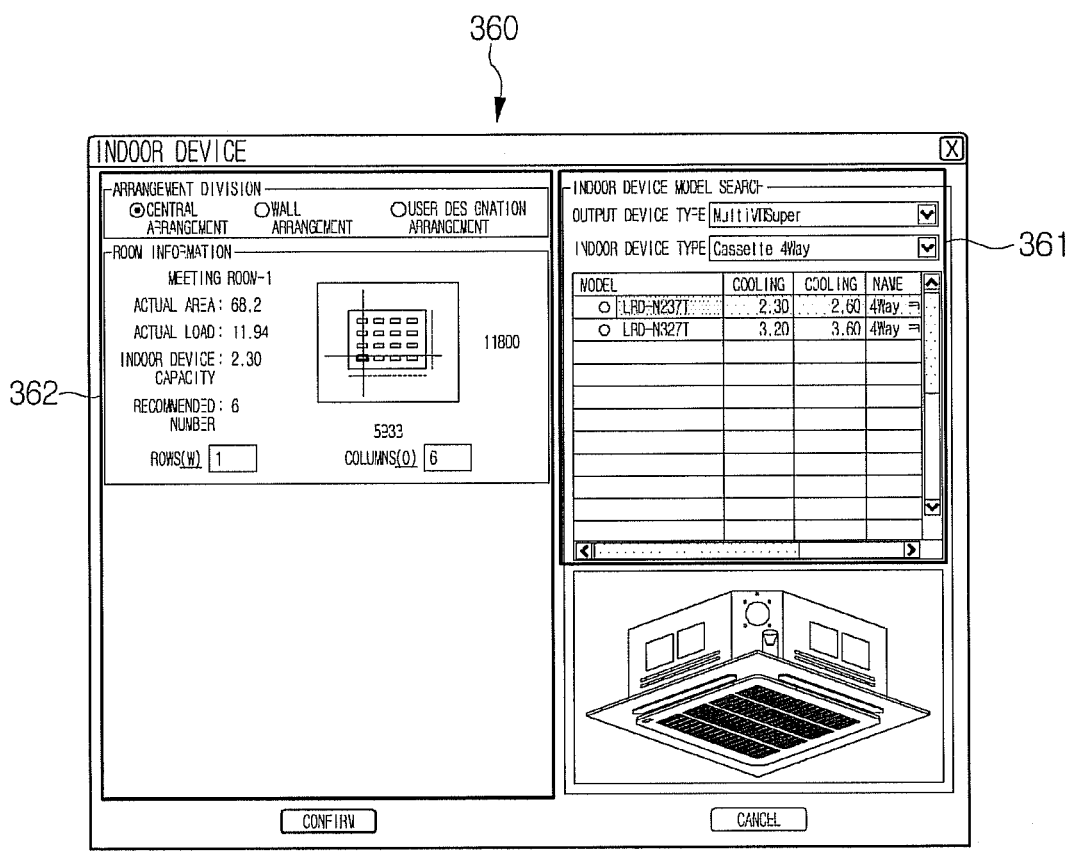
FIG. 7 is a schematic front view of an automatic arrangement display according to an embodiment.

FIG. 6 is a schematic front view of a drawing display having a room area display and a command display during an automatic arrangement process of an indoor device according to an embodiment. FIG. 7 is a schematic front view of an indoor device automatic arrangement display according to an embodiment. Referring to FIGS. 6 and 7, an automatic arrangement process of an indoor device will be described hereinafter.

When the automatic arrangement selector 330 of the product information display 300 is selected, as shown in FIG. 6, the command display 250 may display a message "select the boundary for automatic arrangement of an indoor device". A user may select a room (space) area in which an indoor device is to be arranged among at least one room listed in the drawing display 200, on the basis of such a message. As mentioned above, a room area display 203 may be generated by designating an outer area of a room using, for example, a computer mouse.

Then, when the automatic arrangement selector 330 is selected again, as shown in FIG. 7, the display 20 may display an indoor device automatic arrangement display 360. The indoor device automatic arrangement display 360 may include a model display 361 that allows selection of a type and model of a desired indoor device for arrangement, and an arrangement information display 362 that displays arrangement information on the indoor device of the selected model. The arrangement information display 362 may include an "arrangement division display" that allows selection of whether an indoor device is arranged at a center or a wall of a room and a "room information display" that displays information on a room in which an indoor device is to be arranged.

The room information display may recommend how many indoor devices are optimal for installation in consideration of a room area, load information, and a capacity of a corresponding indoor device. That is, the room information display may display a recommended number of selected indoor devices. Also, the room information display may display information on how to arrange indoor devices, that is, arrangement information.

Accordingly, because of a capacity of an indoor device, room area, and load information, a user does not need to worry about how many indoor devices are arranged and how to arrange the indoor devices. Therefore, ease-of-use may be enhanced.

When an indoor device model is selected through the indoor device automatic arrangement display 360 and a confirm button is input or selected, a user may configure a reference point where an indoor device is to be arranged on the drawing display 200. Also, on the basis of the configured reference point, an indoor device may be automatically arranged. Thus, once the type and model of an indoor device to be arranged are selected, since the indoor device is automatically arranged in the designated room, a user does not need to arrange indoor devices one by one in the drawing display 200.

Figure 8:
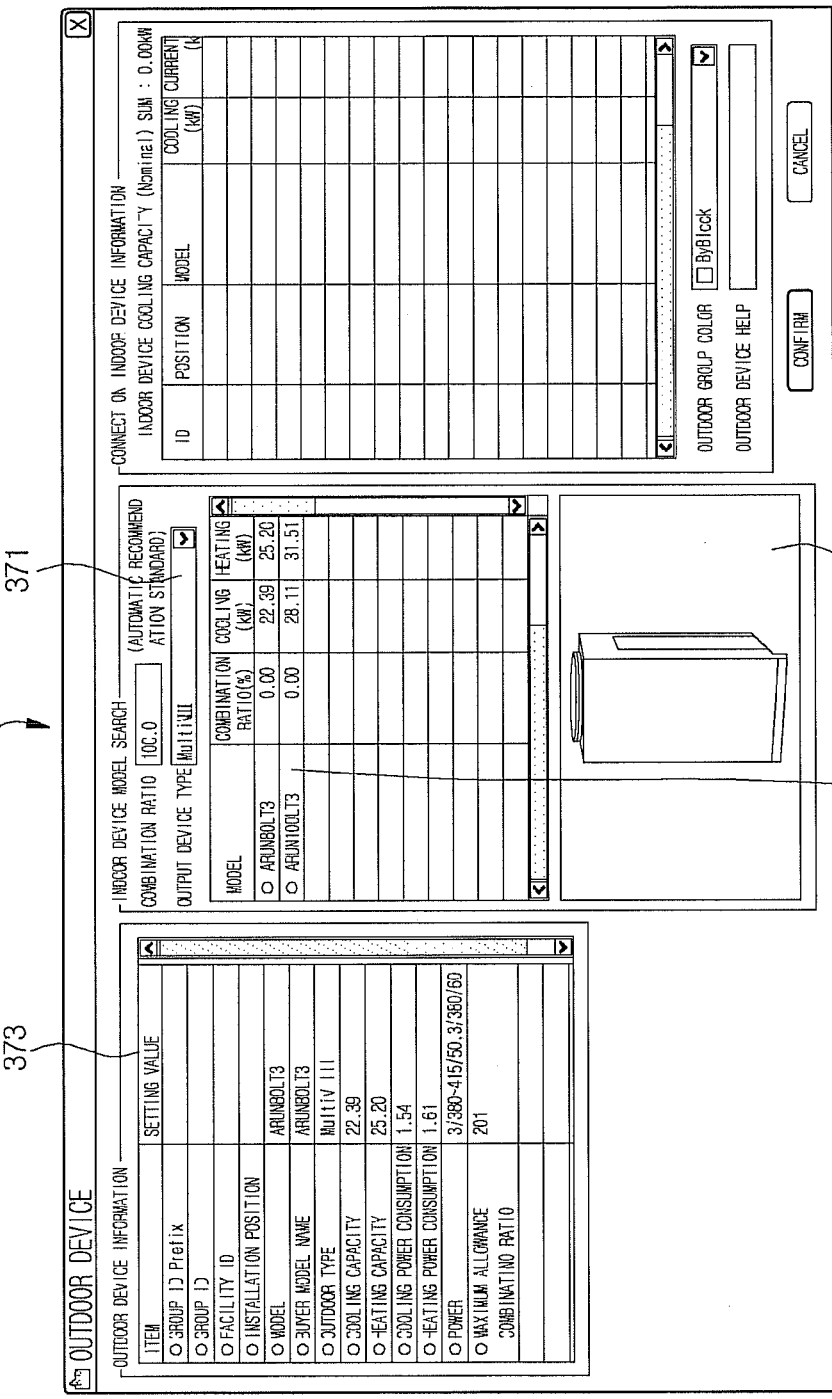
FIG. 8 is a schematic front view of an outdoor device type display according to an embodiment.

FIG. 8 is a schematic front view of an outdoor device type display according to an embodiment. When an outdoor device is selected by the product selector 310, the product information display 300 may display the category selector 312 which displays a category of an air conditioner or HVAC and the list display 320 which displays types of an outdoor device. Then, when one is selected from at least one outdoor device displayed on the list display 210, as shown in FIG. 8, the display 20 may display an outdoor device type display 370.

The outdoor device type display 370 may include a type selector 371 that allows selection of a type of an outdoor device, a model display 372 that displays a model of the selected output device type, an outdoor device information display 373 that displays information relating to an outdoor device of a model selected by the model display 372, and a shape display 374 that displays a shape of the selected model.

The outdoor device type display 370 may further display information on an indoor device(s) connected to the selected outdoor device. The connection indoor device(s) information may be generated or updated during an installation guide process of an air conditioner.

After the type and model of an outdoor device are selected, a "confirm" button may be input or selected, and an outdoor device to be arranged may be determined.

Moreover, the product selector 310 may include "pipe materials" as a product type. When the pipe materials are selected, the list display 320 may display a list of materials relating to a pipe connecting an indoor device(s) with an outdoor device(s).

The list display 320 may include "riser hole". The "riser hole" may be understood as a pipe material connecting a floor with another floor. When the "riser hole" is selected, a riser hole arrangement display (not shown) may be displayed.

The riser hole arrangement display may include riser hole/down hole information. The riser hole/down hole information may include a "riser hole division display" for selection of a refrigerant pipe and a drain pipe as a type of pipe, and a "top floor display" and a "bottom floor display" for selection of top floor and bottom floor information. After information for the riser hole/down hole is input and a confirm button is input or selected, riser hole information may be configured.

Also, a user may select one point of a structure drawing, which may represent a specific floor on the drawing display 200, as a reference point. Once the reference point is selected, the riser hole may be arranged at a same position on each floor on the basis of the configured riser hole information.

Figure 9:
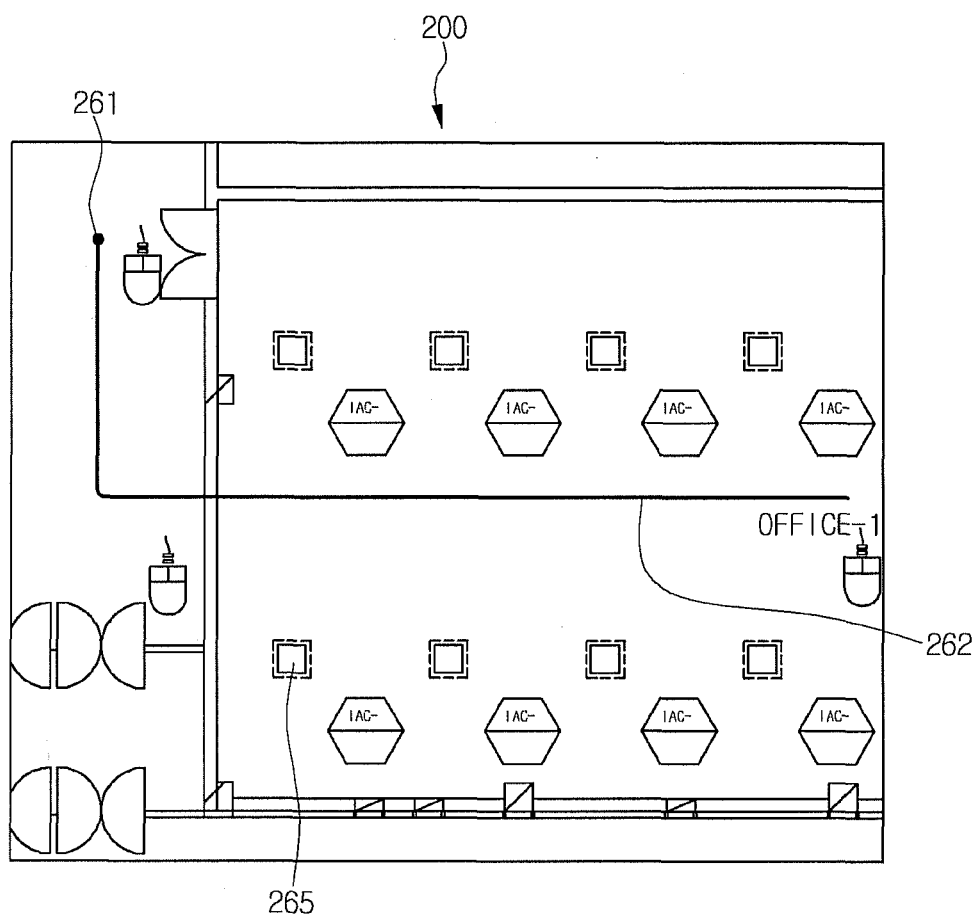
FIG. 9 is a schematic front view of a drawing display when a main pipe is drawn according to an embodiment.
Figure 11:
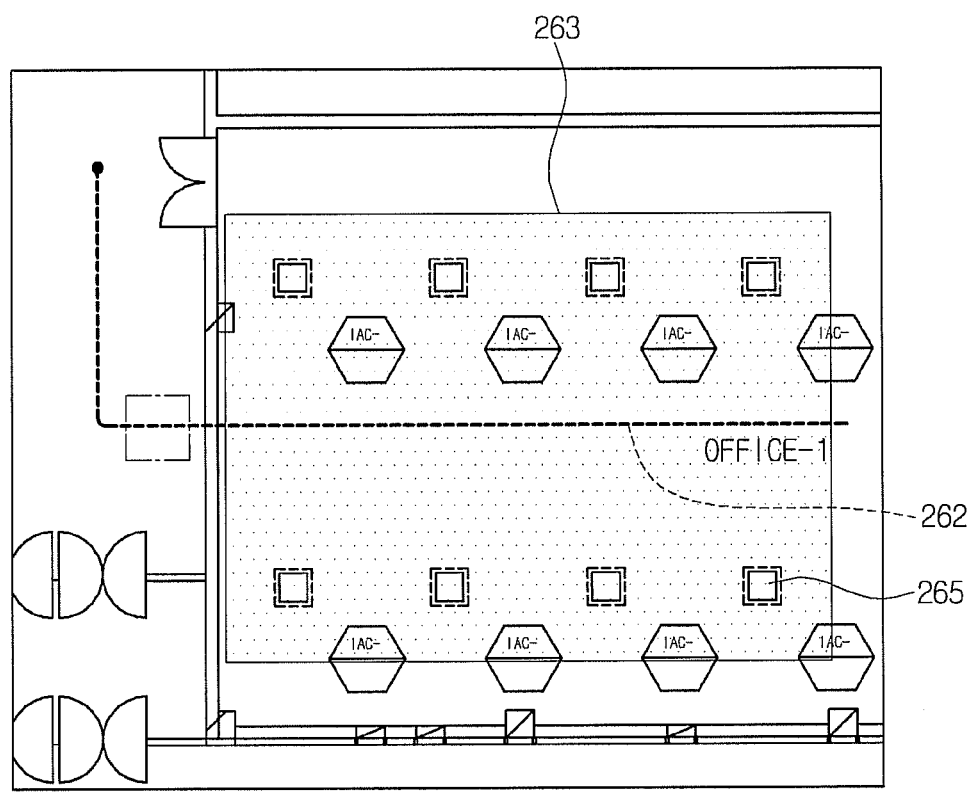
Figure 12:
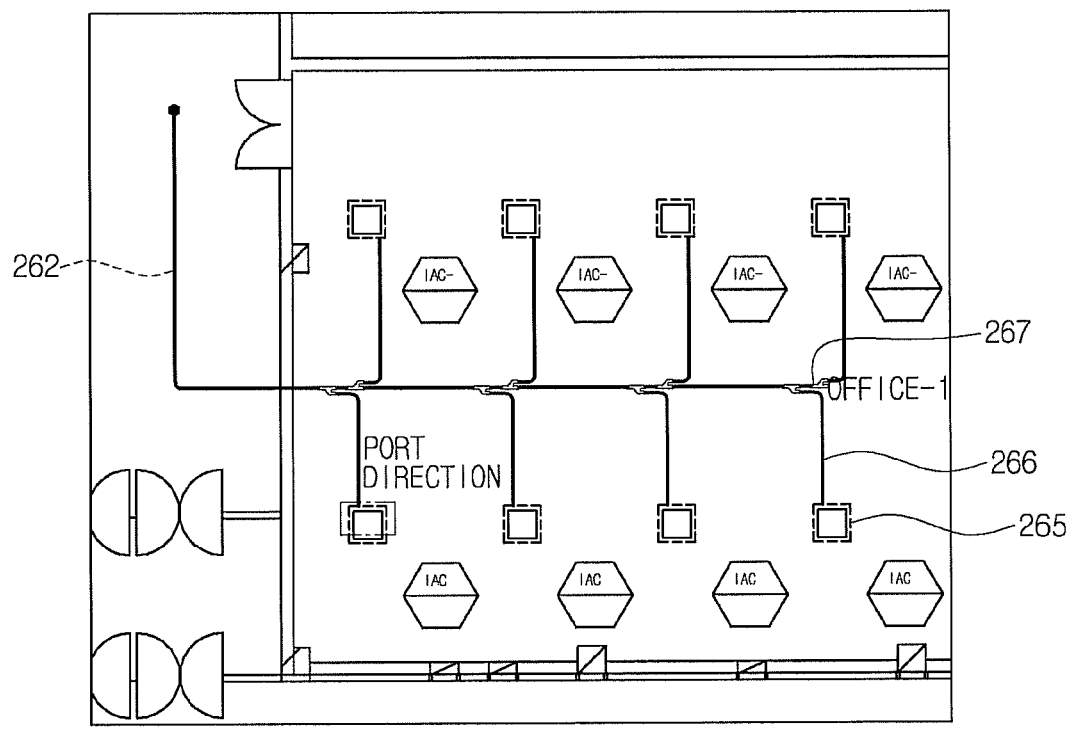

FIG. 9 is a schematic front view of a drawing display when a main pipe is drawn according to an embodiment. FIGS. 10 to 12 are views of a refrigerant pipe and a branched part automatically connected to the main pipe according to an embodiment.

As described above, when an indoor device(s) and an outdoor device(s) are arranged, a main pipe may be configured as a refrigerant pipe connecting an indoor device(s) with an outdoor device(s). First, when a wiring tool 358 (see FIG. 13) in the edit toolbar display 350 is selected, the drawing display 300 may switch into a pipe drawing available state.

In more detail, referring to FIG. 9, an indoor device 265 and an outdoor device arrangement point 261 may be displayed on the drawing display 200. A user may configure the main pipe line 262 from the outdoor device arrangement point 261 or a riser hole reference point (not shown) toward an area where the indoor device 265 is arranged. For example, by drawing a bending line using, for example, a computer mouse, the main pipe line 262 may be displayed.

Also, the command display 250 may display a message for selecting smart wiring S. A user may select the smart wiring, for example, input "S" on a command window, in order to input a smart wiring command.

After the smart wiring command is input, as shown in FIG. 11, the main pipe line 262 displayed on the drawing display 200 may be selected and an indoor device arrangement area may be designated. The indoor arrangement area may be understood as an area including indoor device 265 to which the main pipe is to be connected. That is, an indoor device connection area configurator 263 which may include the indoor device 265 therein may be configured on the drawing display 200.

When the indoor device connection area configurator 263 is configured (displayed), as shown in FIG. 12, a branched pipe 266 may automatically be extended from the main pipe line 262 toward the indoor device 265. Also, a branched part 267 may be automatically arranged at a point where the branched pipe 266 is branched from the main pipe line 262.

Moreover, whether to extend the branched pipe 266, 267 may be determined according to a state of a pipe end connection in a preference display 140 (see FIG. 2). When a refrigerant pipe is configured as or in a "Normal" state through a detailed menu of the pipe end connection, as shown in FIG. 12, the branched pipe 266 may be inserted from the main pipe line 262 so that the indoor device 265 is connected.

Further, when the refrigerant pipe is configured as or in a "Direct" state, unlike FIG. 12, the branched pipe 266 may be directly inserted into the indoor device 265 from the main pipe line 262.

Thus, when the main pipe line 262 is configured after an indoor device(s) and an outdoor device(s) are selected, an arrangement structure in which an indoor device(s) is connected from the main pipe line 262 may be automatically formed. Therefore, easy of use is excellent.

However, unlike the above description, when the smart wiring command is not input, by directly selecting the branched pipe 266, 267 of the list display 320, the branched pipe 266, 267 may be inserted into the drawing display 200. Moreover, although not shown in the drawing, a drain pipe besides the refrigerant pipe may be arranged on the drawing display 200. The drain pipe may extend or be arranged in a direction parallel to the refrigerant pipe.

In more detail, after the wiring tool 358 is selected, a parallel path wiring O displayed on the command display 250 may be selected. Then, after a reference pipe (for example, a reference cooling pipe) to follow a parallel path (direction) is designated, an offset direction may be configured. Then, a drain pipe may be connected along the main pipe line 252 with a predetermined offset. Here, the offset distance may be configured or changed through a "pipe offset" included in the preference display 140.

Figure 13:
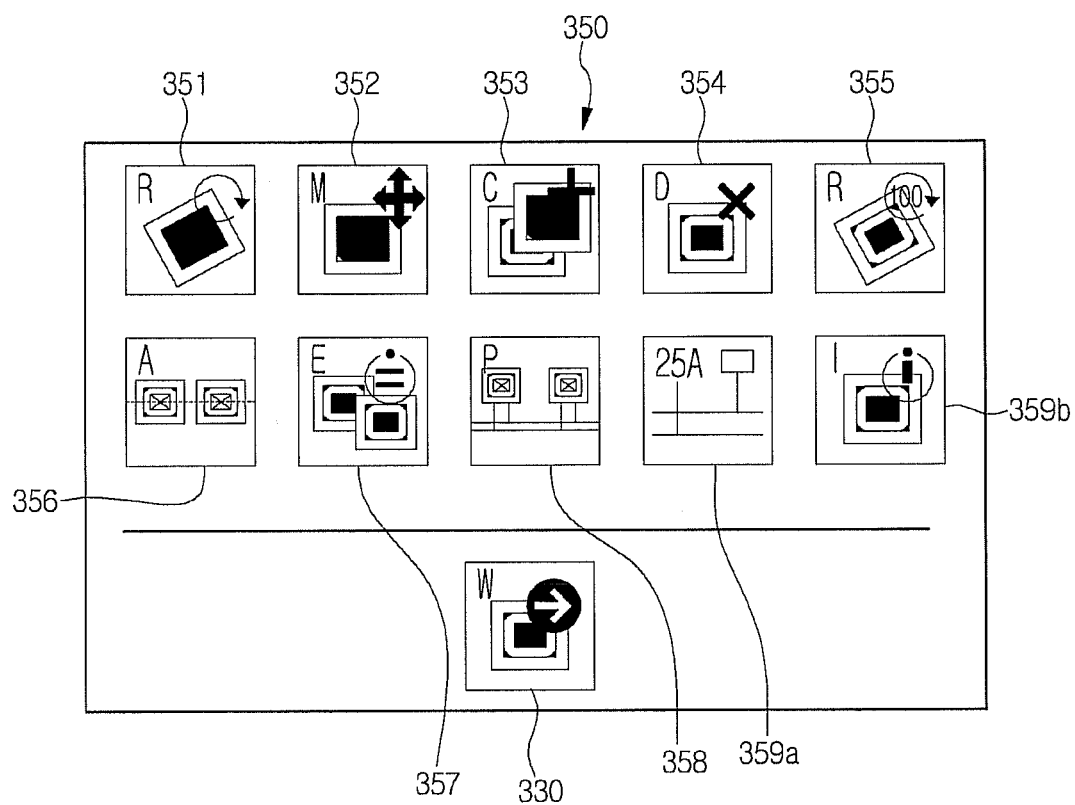
FIG. 13 is a schematic front view of an edit toolbar display according to an embodiment.

FIG. 13 is a schematic front view of an edit toolbar display according to an embodiment. Referring to FIG. 13, the edit toolbar display 350 may include a rotate tool 351. The rotate tool 351 may allow an object, for example, detailed products or apparatuses (materials) constituting an air conditioner or HVAC, to rotate in a specific direction when the object is arranged on the drawing display 200. An icon representing the rotate tool 351 and an object may be sequentially selected and a rotation direction or rotation value may be input, so that the object may be rotated in a desired direction.

The edit toolbar display 350 may further include a move tool 352. The move tool 352 may move an object from a reference point to a selection point. An icon representing the move tool 352 and the object may be sequentially selected, and the reference point and the movement point may be selected (or input), so that the object may be moved. At this point, when the object is connected to another object, it may remain connected as the object moves.

The edit toolbar display 350 may further include a copy tool 353. The copy tool 353 may be selected when a specific object is to be copied. For example, when a plurality of objects are inserted into the drawing display 200, the copy tool 353 may be used.

The edit toolbar display 350 may further include a delete tool 354. The delete tool 354 may delete an object. An object may be deleted by sequentially selecting an icon representing the delete tool 354 and the object, that is, a target to be deleted.

The edit toolbar display 350 may further include a reverse rotate tool 355. The reverse rotate tool 355 may rotate an object in an approximately 180° direction. An object may rotate approximately 180° by sequentially selecting an icon representing the reverse rotate tool 355 and the object, that is, a target to be rotated.

The edit toolbar display 350 may further include an align tool 356. The align tool 356 may be used to align objects in, for example, a vertical or parallel direction. Objects may be aligned in a designated direction by sequentially selecting an icon representing the align tool 356 and objects, that is, targets to be aligned, and designating an alignment direction (for example, vertical or parallel direction). As a selectable alignment option, an object uniform arrangement may be included in a submenu of the align tool 356.

The edit toolbar display 350 may additionally include a match tool 357. The match tool 357 may be used to match object attribute information. When an icon representing the match tool 357 and a plurality of objects, that is, matching targets to icons, are sequentially selected, an attribute of a first selected device may be reflected (matched) on a second selected device.

The edit toolbar display 350 may also include the wiring tool 358. The wiring tool 358 may be used to perform wiring on a refrigerant pipe or a drain pipe on the basis of a port of an object (for example, an indoor device or an outdoor device). After an icon representing the wiring tool 357 is selected, an object or a port may be designated, so that wiring may be performed manually, or a wiring option (for example, smart wiring, and parallel path wiring) may be selected.

The edit toolbar display 350 may also include an annotation tool 359a. The annotation tool 359a may be used to generate an annotation on an object. After an icon representing the annotation tool 359a is selected and, for example, a pipe or riser hole selected for annotation, its position and path may be designated.

The edit toolbar display 350 may further include an attribute tool 359b. The attribute tool 359a may be used to confirm attribute information on an object. After an icon representing the attribute tool 359a is selected, an object, that is, a target for attribute information, may be selected for execution.

For example, when the attribute tool 359a is selected and an indoor device or an outdoor device in the drawing display 200 is selected, the indoor device type display 340 or the outdoor device display 370 in FIG. 4 or 8 may be displayed. At this point, information displayed on the indoor device type display 340 or the outdoor device type display 370 may be changed.

Figure 14:
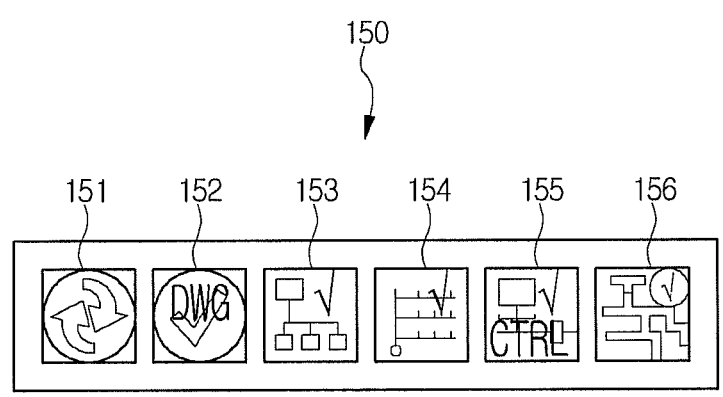
FIG. 14 is a schematic front view of a control toolbar display according to an embodiment.
Figure 15:
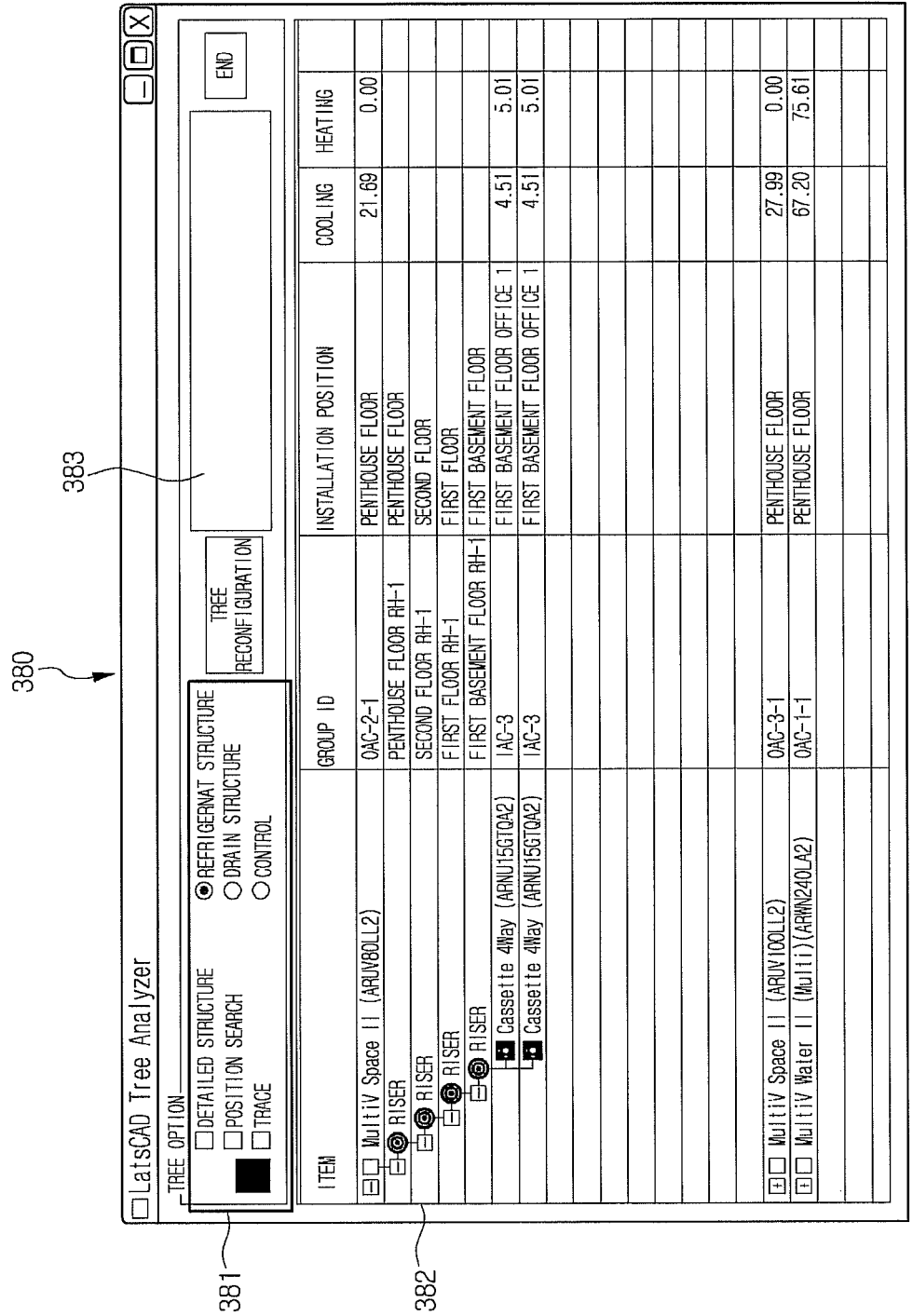
FIG. 15 is a schematic front view of a drawing inspection display according to an embodiment.

FIG. 14 is a schematic front view of a control toolbar display according to an embodiment. FIG. 15 is a schematic front view of a drawing inspection display according to an embodiment.

Referring to FIG. 14, the installation information display 100 may include a selectable control toolbar display 150 that provides for system or arrangement inspection. In more detail, the control toolbar display 150 may include a refresh selector 151 that provides updated installation information on an air conditioner or HVAC, for example, connection information on a detailed product or apparatus (device). When the refresh selector 151 is selected, the drawing on a building structure may be matched (synchronized) to the installation information on an air conditioner or HVAC configured through the system 10.

The control toolbar display 150 may further include a drawing inspection selector 152 that provides for display of drawing information realized in the system 10, for example, a connection structure of an indoor device(s) and an outdoor device(s), and inspection of whether there is any error. When the drawing inspection selector 152 is selected, as shown in FIG. 15, the display 20 may display a drawing inspection display 380. The drawing inspection display 380 may include an option selector 381 that provides for selection of a type of a structure (tree) to be displayed, a drawing configuration information display 382 that displays information on the structure selected by the option selector 381, and an error information display 383 that displays whether there is any error on a connection configuration of a corresponding structure.

In the option selector 381, selectable "detailed structure", "position search", and "trace" buttons may be included as one group, and "refrigerant structure", "drain structure", and "control" buttons may be included as another group. Also, the option selector 381 may further include a selectable input called a "tree reconfiguration".

When a detailed structure is selected by the option selector 381, one of the refrigerant structure, the drain structure, and the control button may be selected, and then, the tree reconfiguration may be input, and a detailed structure corresponding to each structure may be displayed on the drawing configuration information display 382. In FIG. 15, for example, a detailed structure for a refrigerant structure is displayed. The detailed structure includes a refrigerant structure from an outdoor device to a riser hole and an indoor device.

If there is an error in the refrigerant structure (for example, the main pipe described in FIG. 9 may not be properly formed, or a part of the main pipe disconnected), the error information display 383 may display a message of "one connection configuration error occurs and check the list". Also, a list of the corresponding apparatus that generates an error may be displayed using a specific color or may blink in order to make error checking easy.

Further, the control toolbar display 150 may further include a selectable drain pipe check selector 154 that provides for confirmation of a drain pipe connection structure. When the drain pipe check selector 154 is selected, a drain structure of the drawing inspection display 380 may be activated. Also, a diameter of a drain pipe may be automatically configured, so that it may be annotated on the drawing display 200.

Furthermore, the control toolbar display 150 may further include a selectable control check selector 155 that provides for confirmation of a control line of an air conditioner or HVAC. When the control check selector 155 is selected, a control button of the drawing inspection display 380 may be activated. The drawing inspection display 380 may display a cable length on the basis of a central control line of an air conditioner or HVAC and also quantity information on indoor devices connected to a controller.

The control toolbar display 150 may further include a selectable duct check selector 156 that provides for selection of a diameter of a duct and a subsidiary model and calculation of pressure loss values. Also, the drawing relating to the arrangement of a duct may be automatically inserted into the drawing display 200.

FIG. 16 is a schematic front view of a system or arrangement inspection display according to an embodiment. Referring to FIGS. 14 and 16, the control toolbar display 150 may include a selectable system inspection selector 153 that provides confirmation of a system or arrangement verification result value for each apparatus.

When the system or arrangement inspection selector 153 is selected, as shown in FIG. 16, the display 20 may display a system or arrangement inspection display 390. The system or arrangement inspection display 390 may include an inspection or arrangement item display 391 that displays an indoor device(s) based apparatus list, a verification mode selector 392 that provides for selection of a verification required system or arrangement mode, a combination range configurator 393 that configures a combination ratio range of an indoor device(s) and an indoor device(s), and a verification result display 394 that displays a verification result of a system or arrangement. The combination ratio range may be a ratio of an indoor capacity to an outdoor capacity, and a range of a maximum value and a minimum value may be configured.

Also, the system inspection display 390 may further include a plurality of selectable inputs. The plurality of inputs may include a system or arrangement analysis selector 395 that provides for a request for a system or arrangement analysis, a report output selector 396 that outputs design information on an air conditioner or HVAC arrangement in a report form, and an apparatus table selector 397 that provides for output of information on apparatuses and pipes applied to a design drawing in a table form.

Also, the inspection item display 391 may further include a group ID, installation position, combination ratio, and cooling and heating capacity of an outdoor device(s). Also, the inspection item display 391 may include a check box that displays a plurality of outdoor devices applied to a design drawing, and provides for selection of at least one outdoor device for system or arrangement analysis.

After at least one outdoor device is selected through the check box, when the system or arrangement analysis selector 395 is selected, an analysis time (a check time) at which an analysis is performed and also a display representing whether an analysis is completed may be sequentially displayed depending on time elapsed. This display may be displayed on the inspection item display 391 as an item such as Pipe (being analyzed) and Syst. (analysis completed).

Also, a capacity verification result may be further displayed on the verification result display 394. The verification result contents may include information relating to a pipe length and information relating to a height difference between an outdoor device(s) and an indoor device(s). For example, the verification result contents may include "a total pipe length", "a longest pipe length (equivalent length)", "a longest pipe length after a first branched pipe", "a height difference (above an outdoor device), "a height difference (below an indoor device)", "a height difference (between indoor devices)", and "a longest pipe length (mounting)".

Also, limit and current values relating to contents of the verification result information may be displayed on the verification result display 394. That is, the limit and current value may be displayed and compared. If the current value is within the limit value and the combination ratio and the cooling and heating capacity are within a configuration range, an air conditioner or HVAC may be understood as being successfully configured. In this case, for example, without an error message, a message "system inspection is successfully completed" may be displayed on the verification result display 394.

On the other hand, if the current value is out of the limit value, or the combination ratio is out of the range of the combination range configurator 393, or the cooling and heating capacity is less than an actual load, a message for representing that an error occurs in design information of an air conditioner or HVAC may be output. Here, the actual load is a determined value on the basis of an area of a room in which an air conditioner or HVAC is to be installed and sensible heat generation.

For example, when the combination ratio is out of the range that the combination range configurator 393 configures, an error message "a combination ratio is out of a configuration range" may be displayed. Also, if the cooling and heating capacity of the indoor device(s) are less than the actual load, a message "cooling load of (specific) room at (specific) floor: indoor unit capacity (6.00 KW)<actual load (10.78 KW) is less than the reference value" may be output. Also, a list of the corresponding apparatus that generate an error may be displayed using a specific color or may blink in order to make error checking easy.

While system or arrangement inspection is successfully completed, if the report output selector 396 is selected, the display 20 may display a report item display (not shown). The report item display may include an output item selector that provides for selection of items that are included in a report to be output and a user may check desired items and then may press a confirm button.

Once the confirm button is input or pressed, a report (not shown) may be displayed. The report may include installation information on an air conditioner or HVAC. The installation information on the air conditioner or HVAC may include information on an indoor device(s), an outdoor device(s), and a ventilation device(s), for example, information on the type, quantity, cooling and heating capacity, power consumption, or access port size of each apparatus. Such a report may be delivered to a customer (such as building owners and/or architects).

Figure 17:
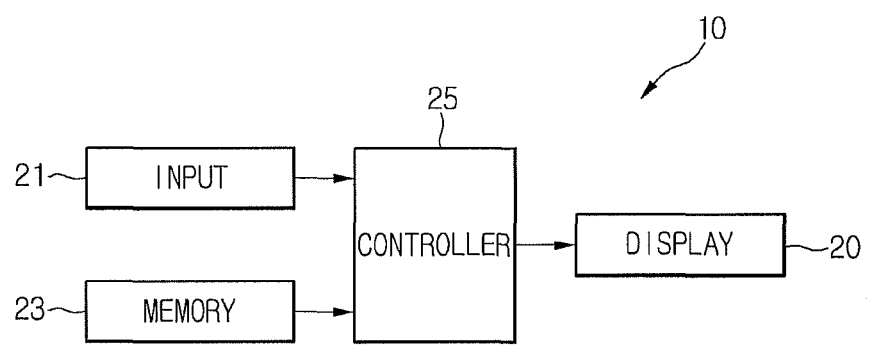
FIG. 17 is a block diagram of an installation guide system according to an embodiment.

FIG. 17 is a block diagram of an installation guide system according to an embodiment. Referring to FIG. 17, the installation guide system 10 may include an input 21 that receives input of a predetermined command for an arrangement design of an air conditioner or HVAC, a memory 23 that stores information, such as drawing information on a space in which an air conditioner or HVAC is to be installed, the display 20, which displays a process for configuring an arrangement of the air conditioner or HVAC, and a controller 25 that controls the input 21, the memory, and the display 20.

The input 21 may be, for example, a keyboard or a mouse of a computer. However, if a user command is input to the installation guide system 10, any form of an input may be possible.

The memory 23 may store information, such as drawing information including at least one structure among information on a building in which an air conditioner or HVAC is to be installed, floor information, and/or room information. Such drawing information may be delivered from a customer (such as a building owner and/or architect) and may be stored in the system 10. Also, in the process of configuring the arrangement of an air conditioner or HVAC, such drawing information may be displayed on the display 20.

Figure 18:
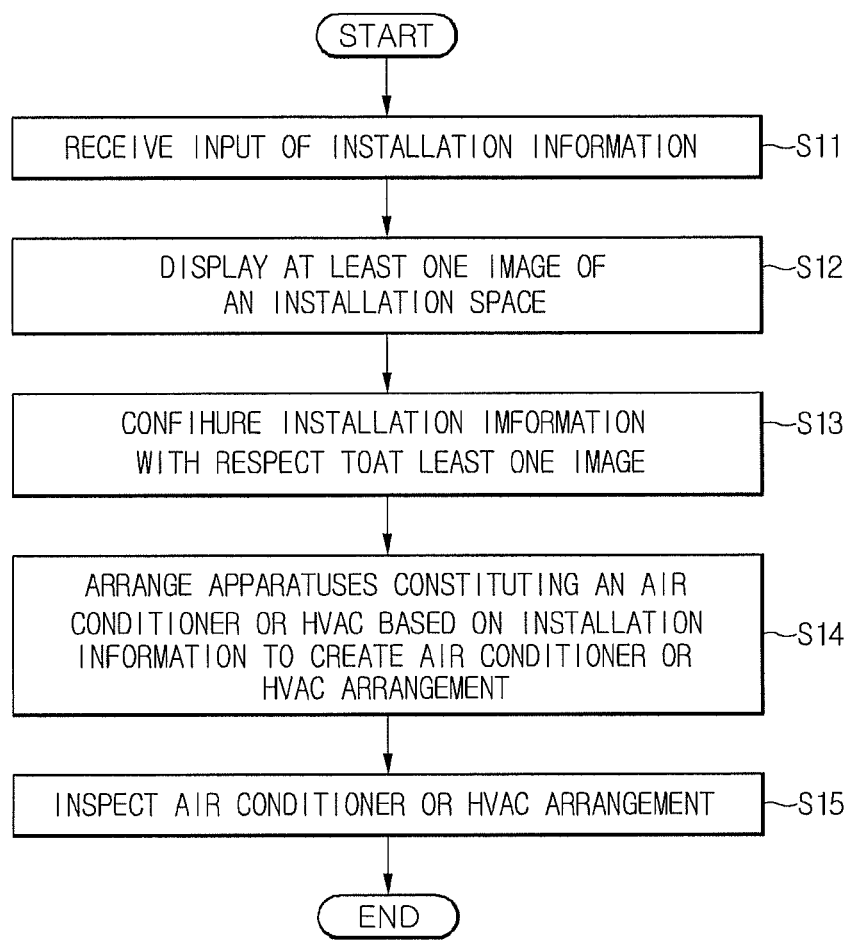
FIG. 18 is a flowchart of a method of using an installation guide system to configure an air conditioner or HVAC arrangement according to embodiments.

FIG. 18 is a flowchart of a method of using an installation guide to configure an air conditioner or HVAC arrangement according to embodiments. The method according to embodiments is discussed herein as used to configure an air conditioner or HVAC. However, embodiments are not so limited. That is, the installation guide system may be used to configure any type of cooling and/or heating system.

Referring to FIG. 18, a method of using an installation guide system, such as installation guide system 10 of FIGS. 1-17, will be described according to embodiments discussed hereinafter. By executing a specific program, the display, such as display 20 of the installation guide system 10 of FIGS. 1-17, may display the program. First, the installation guide system may receive input of installation information, in step S11. That is, startup environment/installation information (or driving condition information) may be configured by using a menu displayed on the display. Here, a method of configuring the startup environment or setting preferences of a system or arrangement may include a process for generating a process (project) for installing an air conditioner or HVAC, generating space information, and designating an area where the air conditioner or HVAC is to be installed.

Once the startup environment is configured and the installation information input, a process for arranging a detailed apparatus of the air conditioner or HVAC may be performed. That is, at least one image of an installation space may be displayed on the display, in step S12, and the installation information may be configured with respect to the at least one display, in step S13. Next, apparatuses constituting an air conditioner or HVAC may be arranged to create an air conditioner or HVAC arrangement, in step S14.

More particularly, an indoor device(s), an outdoor device(s), and other pipe(s), may be arranged. First, the indoor device(s) may be arranged. An indoor device(s) may be selected as a type of product displayed on the product information display, such as product information display 300 of the installation guide system 10 of FIGS. 1-17, and then, the type and model of the indoor device(s) may be selected. The indoor device(s) of the selected model may be automatically arranged on the drawing display, such as drawing display 200 of the installation guide system 10 of FIGS. 1-17. At this point, by selecting an automatic arrangement selector, such as automatic arrangement selector 330 of the installation guide system 10 of FIGS. 1-17, an automatic arrangement command for the indoor device(s) may be input. Then, on the basis of a message output to a command display, such as command display 250 of the installation guide system 10 of FIGS. 1-17, a room boundary for automatically arranging the indoor device(s) may be selected.

Then, on the basis of area and load information of a room(s) in which the indoor device(s) is to be installed, an installation number of indoor devices may be recommended. Once a user confirmation input is made, according to the input information, the indoor device(s) may be automatically installed on the drawing display.

Next, an outdoor device(s) may be arranged. In more detail, an outdoor device(s) may be selected as a type of product displayed on the product information display, and then, a type and model of the outdoor device(s) may be selected.

Then, the outdoor device(s) of the selected model may be arranged at one or more points on the drawing display. For example, when one point of the drawing display is clicked using, for example, a computer mouse, an outdoor device of the selected model may be inserted into the drawing display.

Once the arrangements of the indoor device(s) and the outdoor device(s) are made, a riser hole insertion point connecting a floor and another floor may be designated. Then, by selecting a wiring tool, such as wiring tool 358 of the installation guide system 10 of FIGS. 1-17, of an edit toolbar display, such as edit toolbar display 350 of the installation guide system 10 of FIGS. 1-17, a main pipe, such as main pipe line 262 of the installation guide system 10 of FIGS. 1-17, connected from the riser hole insertion point to the indoor device may be drawn. For example, straight or bending lines may be displayed on the drawing display using, for example, a computer mouse.

Once the main pipe line is inserted on the drawing display, by inputting "smart wiring" on the command display, a branched pipe, such as branched pipe(s) 266, 267 of the installation guide system 10 of FIGS. 1-17, or a header, which may be connected from the main pipe line to the indoor device(s), may be automatically inserted. Here, the header may be understood as a component coupled to the branched pipe to guide the branching of a refrigerant.

When the apparatuses (i.e., an indoor device(s), an outdoor device(s), and a pipe(s)) of an air conditioner or HVAC are all inserted, a system or arrangement inspection may be made on whether an arrangement of the air conditioner or HVAC is made effectively or contains errors, in step S15.

More particularly, first, drawing inspection may be made on whether apparatuses and pipes inserted on the drawing display, that is, the created drawing are effectively connected or contains errors. The drawing inspection may be performed by selecting a drawing inspection selector, such as drawing inspection selector 152 of the installation guide system 10 of FIGS. 1-17, of a control toolbar display, such as control toolbar display 150 of the installation guide system 10 of FIGS. 1-17.

When the drawing inspection selector is selected, in order to confirm whether a refrigerant pipe or a drain pipe is effectively arranged, the detailed structure of the drawing may be displayed. The detailed structure may be a tree structure to easily confirm a connection relationship from an outdoor device to a riser hole and an indoor device.

Also, the effectiveness inspection of the system or arrangement, that is, effective inspection/verification, may be made in order to confirm a verification result of a system for each apparatus. The effectiveness inspection/verification may be performed by selecting a system or arrangement inspection selector, such as system inspection selector 153 of the installation guide system 10 of FIGS. 1-17, of the control toolbar display.

Once the system or arrangement inspection selector is selected, a list of apparatuses constituting an air conditioner or HVAC may be displayed on the basis of an outdoor device(s), and by inputting a "system analysis" command, verification may be made on whether the combination ratio and cooling and heating capacity of an outdoor device(s) and an indoor device(s) are appropriate. Also, verification may be made on whether information values relating to a length of a pipe(s) or a height of an outdoor device(s) (indoor device(s)) constituting an air conditioner or HVAC are within a limit value.

Also, once the drawing and system effectiveness inspections are completed, a report and an apparatus list including information on the verification result may be output.

Thus, by using the installation system 10, a design relating to the apparatus selection and arrangement of an air conditioner or HVAC may be easily made, so that the installation of an air conditioner or HVAC may be effectively provided.

According to embodiments, in relation to an installation guide system of an air conditioner or HVAC, an installation environment of a building may be stored from an actual drawing relating to the building, and according thereto, selection or arrangement of an air conditioner or HVAC proper for the stored installation environment may be made. Therefore, an air conditioner or HVAC optimized for a building's environment may be installed.

Additionally, on the basis of building space information and usage information (for example, generated calorie information), necessary cooling and heating capacity may be calculated, and a number of indoor devices to be used and capacity of an outdoor device may be determined. Therefore, an installation process of an air conditioner or HVAC may be easy.

Additionally, after a simulation on the installation of an air conditioner or HVAC is completed, a drawing and system inspection process may be performed. Therefore, whether installation information on the designed air conditioner or HVAC is appropriate may be verified. If the installation information is not proper, a corresponding error may be confirmed and edited.

Additionally, since installation information on the designed and verified air conditioner is provided to a customer (for example, a building owner or an installation shop) in a report form (for example, installation reports and apparatus schedules), the customer may easily confirm the installation information of the air conditioner or HVAC.

Additionally, as an installation guide system of an air conditioner or HVAC is provided as a drawing program, a designer may easily manipulate it. In more detail, a main menu on which a user can see installation information and product information at a glance may be displayed on a display of the system, and a result that a detailed menu of the main menu is selected may be confirmed in the drawing. Therefore, a design process may be accurately performed.

According to an embodiment, in relation to an installation guide system of an air conditioner or HVAC, an installation environment of a building may be stored from an actual drawing relating to the building, and according thereto, selection or arrangement of an air conditioner or HVAC proper for the stored installation environment may be made. Therefore, an air conditioner or HVAC optimized for a building's environment may be installed, and also industrial applicability may be considerable.

Embodiments disclosed herein provide a method of using an installation guide system to configure an air conditioner or HVAC arrangement to guide proper installation of the air conditioner or HVAC.

Embodiments disclosed herein provide a method of using an installation guide system for an air conditioner that may include executing predetermined information to use the installation guide system for the air conditioner; displaying a display unit or display including a drawing displaying unit or display; configuring driving condition information on the installation guide system; arranging apparatuses constituting the air conditioner on the drawing displaying unit; and verifying whether the air conditioner is effectively arranged.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of using an installation guide system to configure an air conditioner or Heating, Ventilation and Air Conditioning (HVAC) arrangement, the installation guide system including an input configured to receive inputs from a user; a memory configured to store information; a display; and a controller configured to control the input, the memory, and the display, the method comprising:
receiving input via the input, into the installation guide system, of installation information to be used to configure the air conditioner or HVAC arrangement;
displaying via the controller, on a drawing display of the display, at least one image of an installation space for the air conditioner or HVAC arrangement;
configuring via the controller the installation information with respect to the at least one image of the installation space;
arranging apparatuses constituting the air conditioner or HVAC arrangement via the controller on the drawing display to create a design drawing for the air conditioner or HVAC arrangement based on the installation information, the apparatuses including at least one indoor device, at least one outdoor device, and at least one pipe; and
inspecting via the controller the air conditioner or HVAC arrangement including at least one of performing via the controller a drawing inspection process or performing a system effectiveness inspection process, wherein the display includes:
an installation information display provided in a first area of the display to allow the installation information to be input, the installation information including information for an installation process, information on the installation space, and preference information for configuring the air conditioner or HVAC arrangement;
the drawing display provided in a second area of the display and displaying information on a space having the air conditioner or HVAC arrangement installed and arrangement information on devices of the air conditioner or HVAC arrangement; and
a product information display provided in a third area of the display and displaying information on the at least one indoor device, the at least one outdoor device, and the at least one pipe to be arranged in the space, wherein the inspecting via the controller the air conditioner or HVAC arrangement includes performing the system effectiveness inspection process, which includes:
displaying information relating to a ratio of a capacity of the at least one indoor device to a capacity of the at least one outdoor device and whether a cooling and heating capacity is less than an actual load, which is a value determined on the basis of an area of the installation space and heat generation; and outputting an error message if the ratio is out of a predetermined limit value range, or the cooling and heating capacity is less than the actual load.

2. The method according to claim 1, wherein the configuring the installation information with respect to the at least one image of the installation space includes at least one of:
generating information on the installation space in which the air conditioner or HVAC arrangement is to be installed; or
designating an area of the installation space in which the air conditioner or HVAC arrangement is to be installed.

3. The method according to claim 2, wherein the information on the installation space includes at least one of information on a building in which the air conditioner or HVAC arrangement is to be installed, information on floors constituting a building in which the air conditioner or HVAC arrangement is to be installed, or information on rooms constituting floors constituting a building in which the air conditioner or HVAC arrangement is to be installed.

4. The method according to claim 3, wherein at least one of the building, the floors, or the rooms are available for addition and deletion.

5. The method according to claim 2, wherein the configuring the installation information with respect to the at least one image of the installation space includes generating information on the installation space in which the air conditioner or HVAC arrangement is to be installed, and wherein the generating information on the installation space includes displaying pre-determined building drawing information on the drawing display.

6. The method according to claim 2, wherein the configuring the installation information with respect to the at least one image of the installation space includes designating the area of the installation space in which the air conditioner or HVAC arrangement is to be installed, and wherein the designating of the area of the installation space in which the air conditioner or HVAC arrangement is to be installed includes designating a boundary area of a floor or a room in drawing information displayed on the drawing display.

7. The method according to claim 1, wherein the arranging of the apparatuses on the drawing display includes arranging the at least one indoor device, the at least one outdoor device, and the at least one pipe on the drawing display.

8. The method according to claim 7, wherein the arranging of the apparatuses on the drawing display includes arranging that least one indoor device on the drawing display, and wherein the arranging of the at least one indoor device on the drawing display includes:
determining a type of the at least one indoor device; and
automatically arranging the at least one indoor device of the determined type on the drawing display.

9. The method according to claim 8, wherein the automatically arranging of the at least one indoor device includes recommending an installation number of indoor devices on the basis of information on an installation space in which the at least one indoor device is to be installed.

10. The method according to claim 7, wherein the arranging of the apparatuses on the drawing display includes arranging the at least one outdoor device on the drawing display, and wherein the arranging of the at least one outdoor device on the drawing display includes:
determining a type of the at least one outdoor device; and
designating a place in which the at least one outdoor device is to be arranged on the drawing display.

11. The method according to claim 7, wherein the arranging of the apparatuses on the drawing display includes arranging the at least one pipe on the drawing display, and wherein the arranging of the at least one pipe on the drawing display includes:
displaying a main pipe that extends from the at least one outdoor device to an area in which the at least one indoor device is arranged; and
designating an arrangement area including the at least one indoor device to which the main pipe is connected.

12. The method according to claim 11, wherein the arranging of the at least one pipe on the drawing display further includes:
extending a branched pipe from the main pipe toward the at least one indoor device; and
arranging a branch at a location at which the branched pipe is branched from the main pipe.

13. The method according to claim 1, wherein the inspecting the air conditioner or HVAC arrangement includes performing the drawing inspection process, which includes inspecting whether an apparatus and a pipe presented in the design drawing of the air conditioner or HVAC arrangement on the drawing display are at least one of effectively connected or effectively arranged.

14. The method according to claim 13, wherein the performing of the drawing inspection process includes displaying a structure relating to a refrigerant structure connecting the at least one outdoor device and the at least one indoor device, a drain structure for drainage, and the controller.

15. The method according to claim 13, wherein the performing the drawing inspection process includes performing inspection of connections between the at least one indoor device, the at least one outdoor device, and the at least one pipe.

16. The method according to claim 1, wherein the method is implemented in a PC, a terminal, a server, or a controller.

17. The method according to claim 1, wherein the method is implemented by computer software.

18. A non-transitory computer readable medium having computer-executable instructions for performing a method of using an installation guide system to configure an air conditioner or Heating, Ventilation and Air Conditioning (HVAC) arrangement, the installation guide system including an input configured to receive inputs from a user; a memory configured to store information; a display; and a controller configured to control the input, the memory, and the display, the method comprising:
receiving input via the input, into the installation guide system, of installation information to be used to configure the air conditioner or HVAC arrangement;
displaying via the controller, on a drawing display of the display, at least one image of an installation space for the air conditioner or HVAC arrangement;
configuring via the controller the installation information with respect to the at least one image of the installation space;
arranging apparatuses constituting the air conditioner or HVAC arrangement via the controller on the drawing display to create a design drawing for the air conditioner or HVAC arrangement based on the installation information, the apparatuses including at least one indoor device, at least one outdoor device, and at least one pipe; and
inspecting via the controller the air conditioner or HVAC arrangement including at least one of performing via the controller a drawing inspection process or performing a system effectiveness inspection process, wherein the display includes:
an installation information display provided in a first area of the display to allow the installation information to be input, the installation information including information for an installation process, information on the installation space, and preference information for configuring the air conditioner or HVAC arrangement;
the drawing display provided in a second area of the display and displaying information on a space having the air conditioner or HVAC arrangement installed and arrangement information on devices of the air conditioner or HVAC arrangement; and
a product information display provided in a third area of the display and displaying information on the at least one indoor device, the at least one outdoor device, and the at least one pipe to be arranged in the space, wherein the inspecting via the controller the air conditioner or HVAC arrangement includes performing the system effectiveness inspection process, which includes:
displaying information relating to a ratio of a capacity of the at least one indoor device to a capacity of the at least one outdoor device and whether a cooling and heating capacity is less than an actual load, which is a value determined on the basis of an area of the installation space and heat generation; an outputting an error message if the ratio is out of a predetermined limit value range, or the cooling and heating capacity is less than the actual load.

* * * * *